US010388638B2

(12) United States Patent
Lin

(10) Patent No.: US 10,388,638 B2
(45) Date of Patent: Aug. 20, 2019

(54) LED LIGHT-EMITTING ASSEMBLY, LED LIGHT-EMITTING PANEL, AND LED DISPLAY SCREEN

(71) Applicant: Shuling Li, Zhanjing, Guangdong (CN)

(72) Inventor: Yi Lin, Guangdong (CN)

(73) Assignee: Shuling Li, Zhanjing, Guangdong (CN)

( * ) Notice: Subject to any disclaimer, the term of this patent is extended or adjusted under 35 U.S.C. 154(b) by 0 days.

(21) Appl. No.: 15/743,137

(22) PCT Filed: Sep. 9, 2016

(86) PCT No.: PCT/CN2016/098611
§ 371 (c)(1),
(2) Date: Jan. 9, 2018

(87) PCT Pub. No.: WO2017/005225
PCT Pub. Date: Jan. 12, 2017

(65) Prior Publication Data
US 2019/0107271 A1  Apr. 11, 2019

(30) Foreign Application Priority Data
Jul. 9, 2015 (CN) .......................... 2015 1 0400412

(51) Int. Cl.
*H01L 25/16* (2006.01)
*H01L 33/62* (2010.01)
(Continued)

(52) U.S. Cl.
CPC ........ *H01L 25/167* (2013.01); *H01L 25/0753* (2013.01); *H01L 33/62* (2013.01);
(Continued)

(58) Field of Classification Search
CPC .............................. H01L 25/167; H01L 33/62
See application file for complete search history.

(56) References Cited

U.S. PATENT DOCUMENTS

| 2004/0208210 A1 | 10/2004 | Inoguchi |
| 2008/0151143 A1 | 6/2008 | Li et al. |
| 2015/0371585 A1* | 12/2015 | Bower ..................... G09G 3/32 345/1.1 |

FOREIGN PATENT DOCUMENTS

| CN | 154355 A | 10/2001 |
| CN | 2817077 Y | 9/2006 |

(Continued)

OTHER PUBLICATIONS

International Search Report for International Application No. PCT/CN2016/098611 dated Dec. 1, 2016.

*Primary Examiner* — Daniel P Shook
(74) *Attorney, Agent, or Firm* — Michael D. Lazzara; Leech Tishman Fuscaldo & Lampl

(57) ABSTRACT

Provided is a light-emitting diode (LED) module, LED panel and LED screen. The LED module includes a composite layer, at least one LED chipset with an LED chip, at least one driver integrated circuit (IC); the composite layer includes a substrate arranged at the front side; the LED chip and the driver IC are installed at the front side of the composite layer, the cathode of the LED chip is connected to the driver IC by golden wire bonding; blind holes are arranged at the front side of the composite layer, the anode of the LED chip is connected to the positive electrode inside the composite layer through one of the blind holes; the wire coming from the VDD pin of the driver IC is connected to the positive electrode inside the composite layer through at least one of the blind holes; the wire coming from the GND pin of the driver IC is connected to the negative electrode inside the composite layer through one of the blind holes; the at least one driver IC is connected with each other through a signal line.

20 Claims, 9 Drawing Sheets

(51) Int. Cl.
*H01L 25/075* (2006.01)
*H01L 23/00* (2006.01)

(52) U.S. Cl.
CPC .... *H01L 24/47* (2013.01); *H01L 2224/05554* (2013.01); *H01L 2224/45144* (2013.01); *H01L 2224/48091* (2013.01); *H01L 2224/48137* (2013.01); *H01L 2224/48228* (2013.01); *H01L 2224/49107* (2013.01); *H01L 2224/49171* (2013.01); *H01L 2224/49175* (2013.01)

(56) References Cited

FOREIGN PATENT DOCUMENTS

| | | | |
|---|---|---|---|
| CN | 101154651 | A | 4/2008 |
| CN | 103811529 | A | 5/2014 |
| CN | 203800046 | U | 8/2014 |
| CN | 104979326 | A | 10/2015 |
| CN | 204857715 | U | 12/2015 |
| CN | 205016161 | U | 2/2016 |
| JP | H06314863 | A | 11/1994 |

\* cited by examiner

US 10,388,638 B2

LED LIGHT-EMITTING ASSEMBLY, LED LIGHT-EMITTING PANEL, AND LED DISPLAY SCREEN

CLAIM OF PRIORITY

This application is a U.S. national stage filing under 35 U.S.C. § 371 of International Application No. PCT/CN2016/098611 filed Sep. 9, 2016, claiming priority to Chinese Patent Application No. 201510400412.9, filed Jul. 9, 2015.

TECHNICAL FIELD

The present disclosure relates to the field of light-emitting diode (LED) display, in particular to an LED module, LED panel and LED screen.

BACKGROUND

Since the transparent light-emitting diode (LED) screen is transparent with no obstacles in the line of sight and provides an outstanding display effect, it becomes more and more popular, and it is more and more widely applied in high-end places such as malls, airports, banks and luxury stores. However, due to the high complexity of internal control circuit in the transparent LED screen, in order to achieve a good transparency, it needs not only to ensure that a basic logic circuit drives all the LED lights to work normally, but also to minimize the obstruction to line of sight caused by the hardware including a mechanical component, a printed circuit board (PCB), a plastic assembly and some electronic components such as a drive integrated circuit (IC), LED lights. Thus, the higher the pixel density of the LED screen is, the more difficult its transparency can be achieved. For example, the common package size of an LED light includes SMD3535 (outline dimension: 3.5 mm×3.5 mm), SMD3528 (outline dimension: 3.5 mm×2.8 mm) and SMD2121 (outline dimension: 2.1 mm×2.1 mm). Since the minimum package size of the driver IC of the LED screen is 4 mm×4 mm, in consideration of the complicated interconnections among the complex logic circuits, it is essentially impossible to achieve a transparent LED screen with a pixel pitch under 5 mm.

SUMMARY

The present disclosure provides a light-emitting diode (LED) module, LED panel and LED screen. In the preset disclosure, a composite layer, in which a conducting layer and an insulating layer are deployed, is arranged, an LED chip and a driver IC are installed at the front side of the composite layer and arranged in a close range, the LED chip is directly connected to the drive IC in a close range by bonding with a golden wire. In this manner, the complexity of the circuit pattern layer is significantly reduced; the LED chip and the driver IC can be installed on the composite layer in high density, thereby achieving an LED screen of exquisite display effect; meanwhile, since the sizes of the unpackaged LED chip and the unpackaged driver IC are extremely small and almost imperceptible to human eyes, an LED screen of high transparency is achieved.

In an aspect, an LED module is provided, which includes a composite layer, at least one LED chipset with an LED chip, at least one driver IC; the composite layer includes a substrate arranged at the front side; the LED chip and the driver IC are installed at the front side of the composite layer, the wire coming from the cathode of the LED chip is connected to the driver IC; blind holes are arranged at the front side of the composite layer, the anode of the LED chip is connected to a positive electrode inside the composite layer through one of the blind holes; a wire coming from the VDD pin of the driver IC is connected to the positive electrode inside the composite layer through one of the blind holes; a wire coming from the GND pin of the driver IC is connected to the negative electrode inside the composite layer through one of the blind holes; the at least one driver IC is connected with each other through a signal line.

In another aspect, an LED panel includes at least two LED modules aforementioned.

In a further aspect, an LED screen includes the LED panel aforementioned.

In embodiments of the present disclosure, a composite layer, in which a conducting layer and an insulating layer are deployed, is arranged, an LED chip and a driver IC are installed at the front side of the composite layer and are powered through the conducting layer inside the composite layer, and the insulation between conducting layers is achieved by the insulating layer; meanwhile, the driver IC and the LED chip are arranged and installed close to each other and are directly connected in a close range by golden wire bonding. In this manner, the complexity of the circuit connections between the driver IC and the LED chip is reduced, the LED chip and the driver IC can be installed on the composite layer in high density, thereby achieving an LED screen of exquisite display effect.

BRIEF DESCRIPTION OF DRAWINGS

In order to make a clear description for the technical solutions in the present disclosure, a simple description about the drawings to be used in the present disclosure is given as below, the drawings stated herein are merely a part of the present disclosure.

Figure 1:
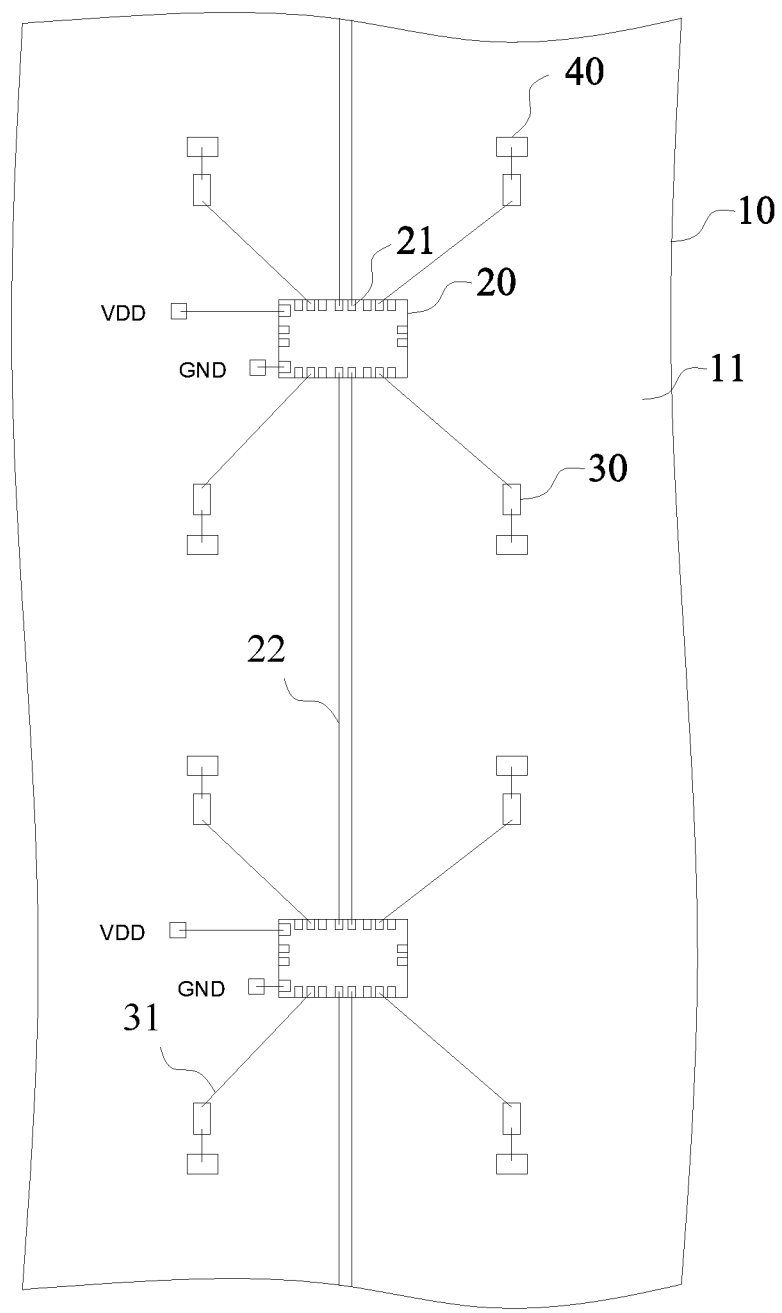
FIG. 1 is a front view of a first embodiment of the LED module provided by the present disclosure.

In the drawings, 10—composite layer; 11—substrate; 12—electrode layer; 121—positive electrode; 122—negative electrode; 13—first insulating layer; 14—third insulating layer; 15—second insulating layer; 16—signal line layer; 20—driver IC; 21—signal pin; 22—signal line; 30—LED chip; 31—wire; 40—pad.

DETAILED DESCRIPTION

In order to make the technical problem, the technical solution and the reachable technical effect clearer, a description for the technical solutions in the present disclosure is given in combination with drawings. The embodiments in the detailed description are merely a part of the embodiments and not the whole embodiments.

It should be understood by those skilled in the art that the pixel pitch of transparent light-emitting diode (LED) screens in the market is commonly above 10 mm and the pixel pitch of some LED screens may reach to 8 mm, but the transparency of these LED screens is not ideal. In a patent application No. CN200610164506.1, the use of the transparent conducting film technology enables to achieve a high transparency. However, due to the weakness of the transparent conducting film such as high resistance and high voltage drop, this material cannot be used to form a tiny line on the plane as the common copper clad laminate PCB does, and cannot accommodate a complex circuit pattern within in a limited range, thus the spacing between LED chips should be enlarged, thus achieving simple functions of lightening and display for simple letters. As for the transparent LED screen disclosed in another patent application No. CN201310011178, in which the driver integrated circuit (IC) is arranged at the horizontally placed LED light bar, it can accommodate a complex logic circuit with a pixel pitch reaching to 8 mm or even 5 mm. However, when the pixel pitch is under 5 mm, the transparency is extremely low and the meaning of the transparent LED screen is lost.

The First Embodiment

FIG. 1 is a front view of the first embodiment of the LED module provided by the present disclosure. As shown in FIG. 1, the LED module includes a composite layer 10, at least one LED chipset with an LED chip 30, at least one driver IC 20; the composite layer 10 includes a substrate 11 arranged at the front side;

the LED chip 30 and the drive IC 20 are installed at the front side of the composite layer 10, a wire 31 coming from the cathode of the LED chip 30 is connected to the driver IC 20; blind holes are arranged at the front side of the composite layer 10, the anode of the LED chip 30 is connected to the positive electrode 121 inside the composite layer 10 through one of the blind holes; a wire 31 coming from the VDD pin of the driver IC 20 is connected to the positive electrode 121 inside the composite layer 10 through one of the blind hole; a wire 31 coming from the GND pin of the driver IC 20 is connected to the negative electrode 121 inside the composite layer 10 through one of the blind hole; the at least one driver IC 20 is connected with each other through a signal line 22.

The front side in this technical solution may refer to a side in the direction of propagation of emitted light, and the direction in which light is emitted is taken as the reference for distinguishing rear and front.

In this technical solution, each LED chipset corresponds with a driver IC 20, the LED chipset and the driver IC 20 are arranged in different rows and spaced in each row.

In this technical solution, the LED chipset is arranged in an array, where the spacing between two adjacent rows is equal to the spacing between two adjacent columns. The light-emitting group is formed by 2×1, 2×2 or 2×3 LED chipsets and each light-emitting group corresponds with a driver IC 20 arranged at the center of the plane of the light-emitting group. Optionally, the embodiments of this technical solution are described based on a 2×2 light-emitting group distribution.

The composite layer 10 is a transparent composite layer 10. The composite layer 10 includes a lamination formed by layers of conductive or insulating transparent material, the insulating transparent material may be polyethylene terephthalate (PET), polyvinyl chloride (PVC), polycarbonate (PC), polyethylene (PE), acrylic, etc.; the conductive transparent material may be an acrylic conductive transparent tape, indium tin oxide (ITO) and indium zinc oxide (IZO). The conductive transparent material may be attached to the surface of an adjacent insulating layer.

A transparent composite layer 10, in which a transparent conductor and a transparent insulator are arranged, is provided. The LED chip 30 and the driver IC 20 are installed at the front side of the transparent composite layer 10. The LED chip 30 may be electrically connected to the driver IC 20 through the transparent conductor inside the transparent composite layer 10. The transparent insulator enables the insulation between the transparent conductors in different layers, a full transparency can be achieved in the area of the transparent composite layer 10 except the LED chip 30 and the drive IC 20, and then an LED screen of the pixel pitch under 5 mm and of the transparency over 90% is provided.

The embodiments in this technical solution may be described based on the way in which the transparent composite layer 10 is implemented.

In related LED display technologies, one or more LED lights are arranged in each pixel to display a predetermined image. However, because of the intrinsic size of the LED light, the pixel of the LED screen made by using related technology is too big to achieve an exquisite display effect. Furthermore, the high transparency will not be achieved due to the obstruction caused by the LED light. In this technical solution, each pixel is implemented based on a tiny LED chip 30 rather than a well-packaged LED light. Optionally, the LED chip 30 may be manufactured in a size of 0.15 mm×0.15 mm, which enables the exquisite pixel output. Meanwhile, an unpackaged bare wafer, which has a size under 2 mm×2 mm and is essentially imperceptible to human eyes from a distance, is adopted as the driver IC 20, which improves the transparency. In the technical solution as shown in FIG. 1, each pixel is provided with an LED chip 30, which enables the simple LED display. The color of the LED chip 30 may be red, green, blue or white. A monochrome LED may be used to display a bulletin board having simple contents and the like.

In this embodiment, the LED chip 30 and the driver IC 20 may be powered through the transparent conductor arranged in the composite layer 10; the signal transmission between the LED chip 30 and the driver IC 20 and the signal transmission between the driver ICs 20 may be achieved through the signal line 22 at the front side of the composite layer 10.

The LED chip 30 and the driver IC 20 may be installed on the substrate 11 by using the chip-on-board (COB) process or the chip-on-glass (COG) process.

The front side of the substrate 11 is covered with transparent sealing glue. The transparent sealing glue commonly may be one of the materials such as polyurethane (PU), epoxy resin, polyethylene-vinyl acetate.

A composite layer 10, in which a conducting layer and an insulating layer are arranged, is provided. The LED chip 30 and the driver IC 20 are installed at the front side of the composite layer 10. This enables the LED chip 30 to be directly connected to the driver IC 20, avoiding the case of a common LED where the driver IC 20 is connected to the LED chip 30 through a complex circuit of a two-layer or multi-layer PCB, and further enabling the driver IC to control the LED chip 30 in a most direct and shortest way, so that the LED chip 30 and the drive IC 20 are installed on the composite layer 10 in high density; meanwhile, since the LED chip 30 and the driver IC 20 are unpackaged and directly installed on the transparent composite layer 10 in the manner of COB or COG, they are essentially imperceptible because of their tiny size. As such, a high transparency and a high-density and exquisite display effect are achieved.

The Second Embodiment

Figure 2:
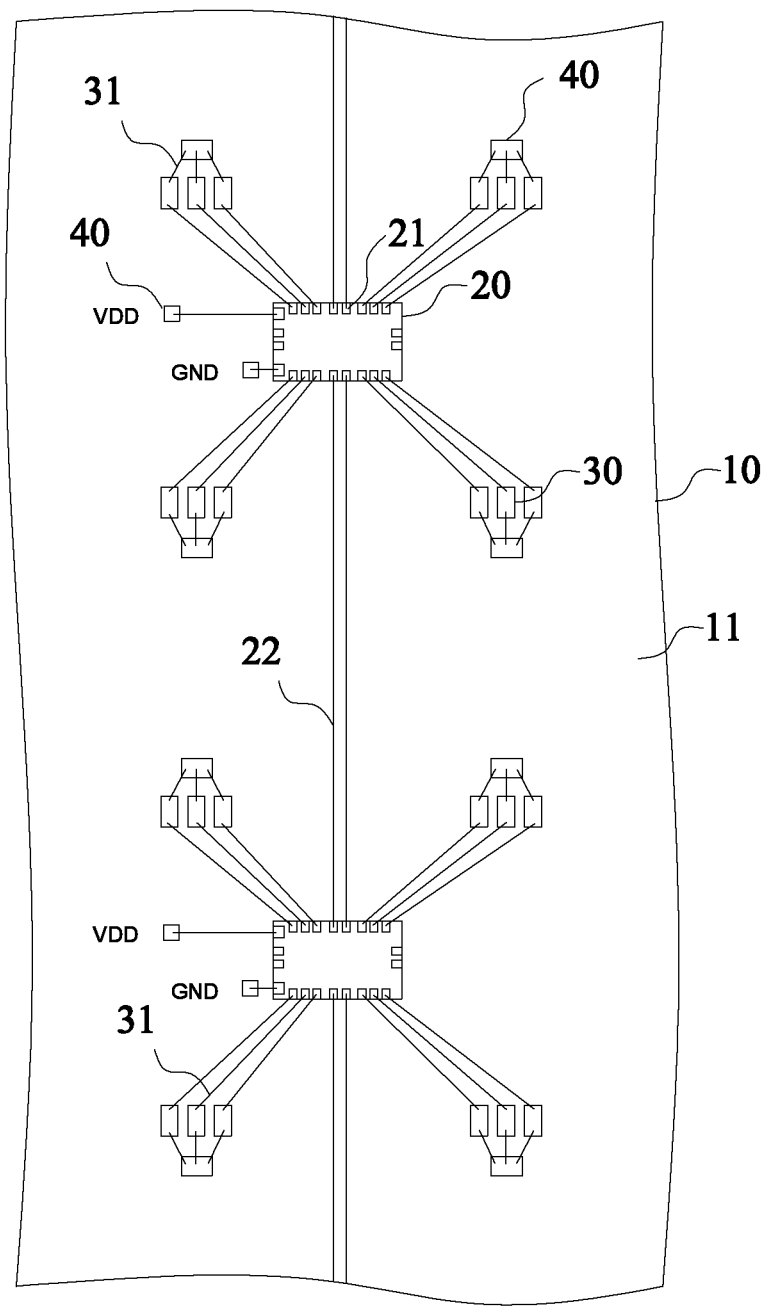
FIG. 2 is a front view of a second embodiment of the LED module provided by the present disclosure.
Figure 3:
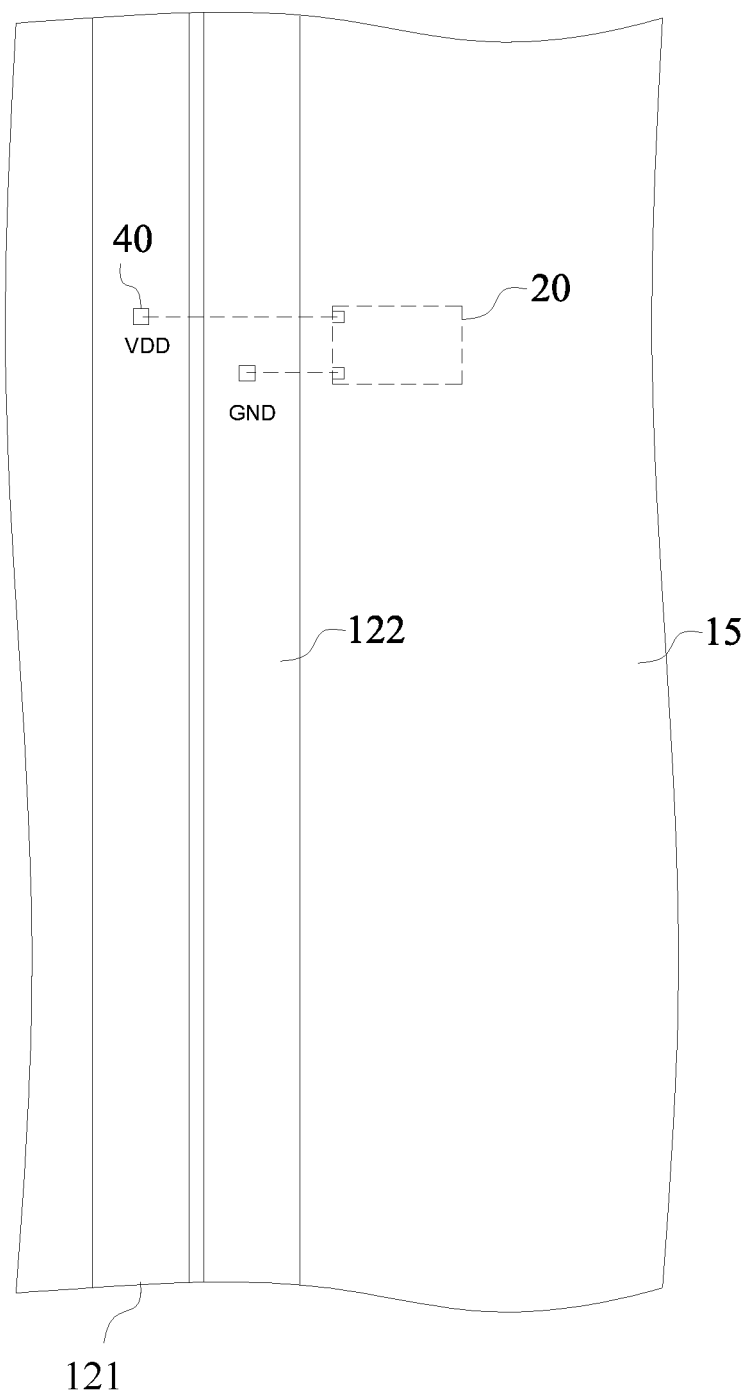
FIG. 3 is a schematic diagram illustrating an electrode distribution of the second embodiment of the LED module provided by the present disclosure.

FIG. 2 is a front view of a second embodiment of the LED module provided by the present disclosure, and FIG. 3 is a schematic diagram illustrating an electrode distribution of the second embodiment of the LED module provided by the present disclosure. As shown in FIG. 2, the LED chipset includes a red-LED (R-LED) chip, a green-LED (G-LED) chip and a blue-LED (B-LED) chip.

The arrangement of three kinds of the LED chips 30 may provide a variety of colors, so as to display a colorful image.

In this embodiment, the composite layer 10 further includes an electrode layer and an insulating layer which are sequentially arranged at the rear side of the substrate 11.

A positive electrode 121 and a negative electrode 122 are arranged in the electrode layer, multiple blind holes are arranged in the substrate 11, which may reach to the positive electrode 121 and the negative electrode 122.

In order to enable the drive IC 20 and the LED chip 30 to work, they need to be powered by the positive electrode 121 and negative electrode 122. As shown in FIG. 3, the electrode layer does not entirely cover the rear side of the substrate 11, while two independent electrodes (a positive electrode 121 and a negative electrode 122) are arranged between the substrate 11 and the insulating layer. The positive electrode 121 and the negative electrode 122 may be seen as in a same layer and work respectively. The electrode layer made from the transparent conductor is extremely thin, so as to reduce the resistance in the circuit during power supply; the width of the electrode layer is usually configured to be large. Optionally, the width of each electrode layer may be set to nearly half of the width of the substrate 11.

In FIG. 3, the blind holes arranged at the substrate 11 are reach to the positive electrode 121 and the negative electrode 122, and two power pins of the driver IC 20 are respectively connected to the positive electrode 121 and the negative electrode 122 through the blind holes; certainly, the anode of the LED chip 30 is connected to the positive electrode 121 through the blind hole.

In order to ensure connections of the driver IC 20 and LED chip 30 to the inner of the composite layer, a pad 40 may arranged at the bottom of the blind hole. In other words, each of the driver IC 20 and the LED chip 30 may be connected to the inductive layer through the pad 40. The wire 31 and the signal line 22 are all bound golden wires. The golden wire is of extremely small radius and is almost imperceptible to human eyes. The connection between the LED chip 30 and the driver IC 20, the connection between the LED chip 30 and the inner of the composite layer 10 and the connection between the driver IC 20 and the inner of the composite layer 10 are all implemented through the golden wires.

The Third Embodiment

Figure 4:
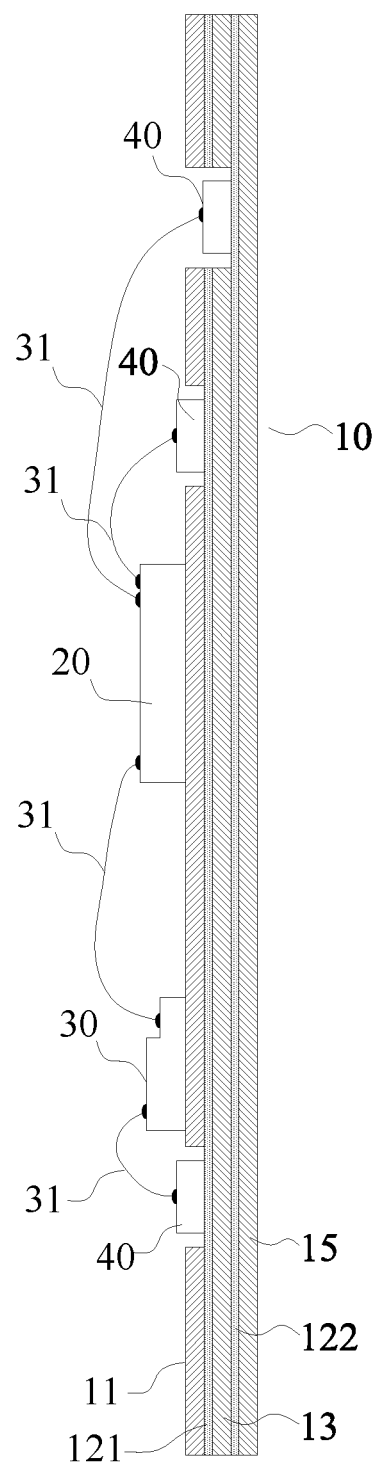
FIG. 4 is a schematic diagram illustrating an internal structure of a third embodiment of the LED module provided by the present disclosure.

FIG. 4 is a schematic diagram illustrating an internal structure of the third embodiment of the LED module provided by the present disclosure. The schematic diagram of the internal structure of this embodiment may be achieved based on the distribution of the LED chip in the second embodiment of FIG. 2. As shown in FIG. 4, the composite layer 10 further includes a first electrode layer, a first insulating layer 13, a second electrode layer and a second insulating layer 15 which are sequentially arranged at the rear side of the substrate; one of the first electrode layer and the second electrode layer is configured to be a positive electrode 121 and the other one is configured to be a negative electrode 122; the blind holes include a first blind hole and a second blind hole, the first blind hole penetrates the substrate 11 and reaches to the positive electrode 121, the second blind hole penetrates the substrate 11 and reaches to the positive electrode 122; the wire 31 coming from the anode of the LED chip 30 is connected to the positive electrode 121 through the first blind hole; the wire 31 coming from the VDD pin of the driver IC 20 is connected to the positive electrode 121 through the first blind hole; the wire coming from the GND pin of the driver IC 20 is connected to the negative electrode 122 through the second blind hole.

It should be noted that FIG. 4 is not a section view at a specific position in FIG. 2, but merely a diagram of the internal structure of the technical solution in the second embodiment. It illustrates the depth of the blind hole and connections between the corresponding electrode layer and the driver IC 20 or the LED chip 30. In this technical solution, all connections to the inner of the composite layer 10 are implemented through pads 40. In the technical solution as shown in FIG. 4, the first electrode layer is configured to be a positive electrode 121 and the second electrode layer is configured to be a negative electrode 122; and they are exchangeable, that is, the first electrode layer is configured to be the negative electrode 122 and the second electrode layer is configured to be the positive electrode 121.

The Fourth Embodiment

Figure 5:
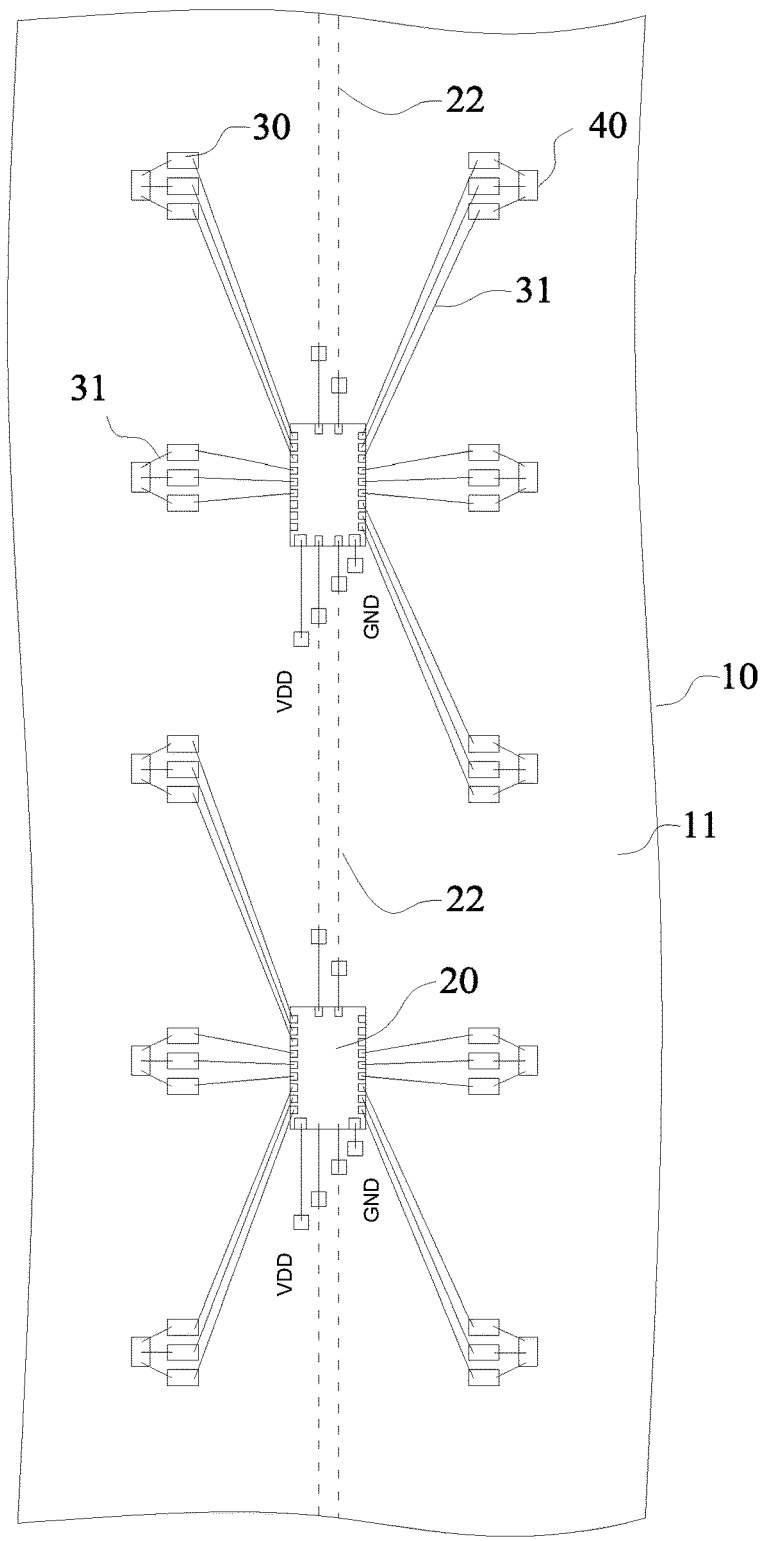
FIG. 5 is a front view of a fourth embodiment of the LED module provided by the present disclosure.
Figure 6:
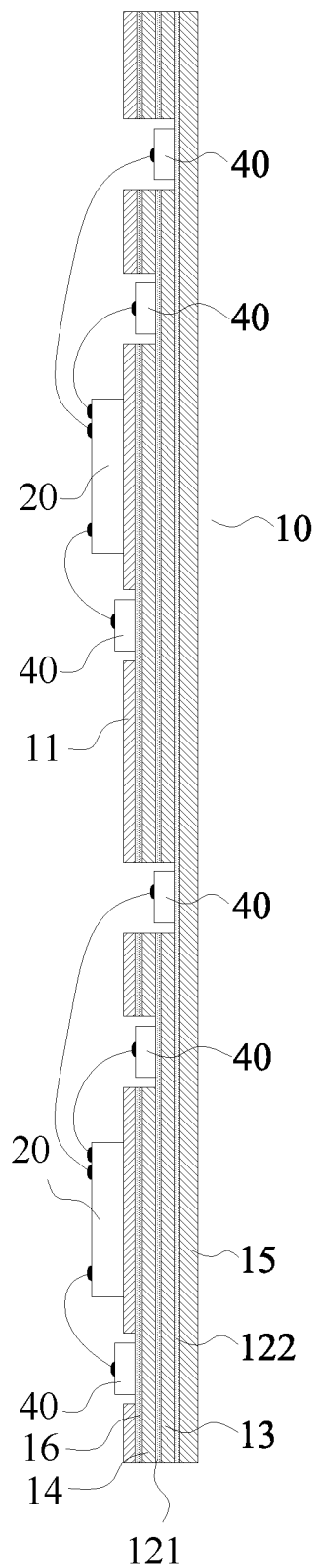
FIG. 6 is a schematic diagram illustrating an internal structure of the fourth embodiment of the LED module provided by the present disclosure.

FIG. 5 and FIG. 6 are front view and schematic diagram illustrating the internal structure of the fourth embodiment provided by the present disclosure. As shown in FIG. 5, every five LED chipsets form a light-emitting group, each light-emitting group corresponding to a driver IC 20 and all the light-emitting group arranged in two adjacent rows, one of the adjacent rows contains two LED chipsets and the other one contains three LED chipsets, the driver IC 20 is arranged between the two adjacent rows.

A driver IC 20 drives five groups of LED chipsets with three LED chipsets in each group, the positions of loaded LEDs driven by two adjacent driver ICs 20 are crossed as shown in FIG. 5. The practical meaning of the driving mode is that, since a common drive IC 20 has 16 channels to drive LED chips 30, 15 channels are needed in the case of 5 groups of LED chipsets to be driven, while 18 channels are needed in the case of 2×3 groups of LED chipsets to be driven, thus 16 channels are not enough. Certainly, if 2×1 groups of the LED chipsets need to be driven, the driver IC 20 with 18 channels may be manufactured accordingly.

Among the distributions (including a 2+3 distribution and a 2×1 distribution) of the driver IC-LED chipset in this embodiment, only a direction relative to the driver IC 20 is convenient for the routing of the signal line 22. When multiple LED modules form a large LED panel, the LED modules may extend only along the horizontal or vertical direction, and the extension along the other direction is restricted by the LED chipset in the same direction. In this situation, an internal structure as shown in FIG. 6 has been proposed and the routing is performed.

As shown in FIG. 6, the composite layer 10 further includes a first electrode layer, a first insulating layer 13, a second electrode layer and a second insulating layer 15 which are sequentially arranged at the rear side of the substrate; one of the first electrode layer and the second electrode layer is configured to be a positive electrode 121 and the other one is configured to be a negative electrode 122; the blind holes include a first blind hole and a second blind hole, the first blind hole penetrates the substrate 11 and reaches to the positive electrode 121, the second blind hole penetrates the substrate 11 and reaches to the negative electrode 122; the wire 31 coming from the anode of the LED chip 30 is connected to the positive electrode 121 through the first blind hole; the wire 31 coming from the VDD pin of the driver IC 20 is connected to the positive electrode 121 through the first blind hole; the wire 31 coming from the GND pin of the driver IC 20 is connected to the negative electrode 122 through the second blind hole; the composite layer further includes a third insulating layer 14 and a signal layer 16 which is insulated from the first electrode layer or the second electrode layer with the third insulating layer 14; the blind holes include a third blind hole which penetrates the substrate 11 and reaches to the signal line layer 16; the signal line is arranged in the signal pattern layer in the signal line layer 16, the wire 31 coming from the signal pin 21 of the driver IC 20 is connected to the signal pattern layer through the third blind hole.

When the signal line 22 is arranged inside the composite layer 10, the signal line 22 is only a thin transparent conducting film. In order to reduce the resistance, the width of the signal line 22 may be extended to form the signal pattern layer.

Since the signal line 22 of the driver IC 20 has at least two lines, at least two layers of the signal line layers 16 and at least two layers of the third insulating layers 14 may be arranged accordingly. Each signal line 22 may form a signal line layer 16 which is insulated from other conducting layers with a third insulating layer 14.

In practical arrangement, the positive electrode 121, the negative electrode 122 and two signal line layers 16 do not have the order for before and after in absolute sense. They only need to implement insulations with each other with the insulating layers and are connected to corresponding components through the blind holes.

Certainly, the arrangement of the LED chip of the second embodiment and other undescribed arrangement of the LED chip may achieve the signal transmission through the build in signal line layers.

The Fifth Embodiment

Figure 7:
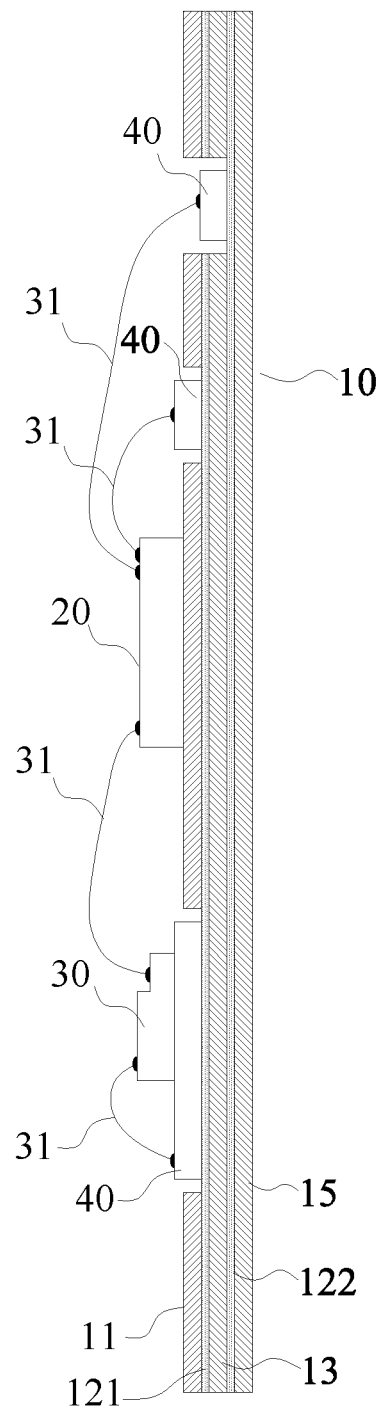
FIG. 7 is a schematic diagram illustrating an internal structure of a fifth embodiment of the LED module provided by the present disclosure.

FIG. 7 is a schematic diagram of the internal structure of the fifth embodiment provided by the present disclosure. As shown in FIG. 7, the R-LED chip is installed on a first pad 40 corresponding to the first blind hole by bonding with silver glue; the G-LED chip and the B-LED chip are installed on a first pad 40 corresponding to the first blind hole by bonding with insulation glue.

Since the pad 40 and the LED chip 30 are not transparent, the installation of the LED chip 30 on the pad 40 may improve the transparency. The non-transparent pad 40 may further block the light emitted by the LED chip 30 towards the rear side of the screen through the composite layer 10. When the technical solution is applied in buildings, the affection of the light emitted by the screen into the indoor space may be effectively eliminated. Meanwhile, the pad, as a mechanical component made of metallic material, may provide a good heat dissipation for the LED chip 30.

It should be noted that the arrangement of the LED chip 30 on the pad 40 is not a specific implementation of the arrangement of LED chips 30. The blind holes in any arrangement may enable the LED chips 30 to be arranged on the corresponding pads and achieve the design effect in this embodiment.

Figure 8:
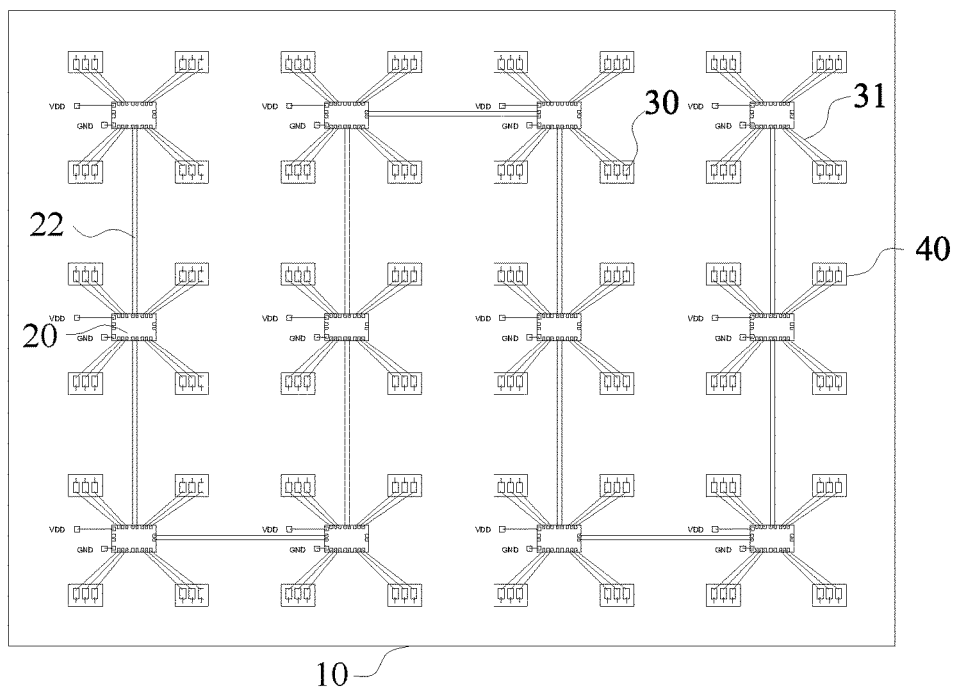
FIG. 8 is a schematic diagram illustrating a routing of the signal line of the LED module provided by the present disclosure.

To sum up, in order to facilitate the following assembly, the LED module may be provided with LED chipsets as more as possible. As shown in FIG. 8, the driver ICs 20 may be successively connected in a "zigzag" manner to form a unidirectional signal link, thereby achieving the transmission and the display of the image data.

The present disclosure further provides an LED panel, which includes at least two aforementioned LED modules. The LED modules are sequentially arranged as shown in FIG. 9.

The LED modules may be successively connected in a "zigzag" manner to form a unidirectional signal link. Alternatively, each LED module may be connected to a signal bus to achieve the signal access.

Figure 9:
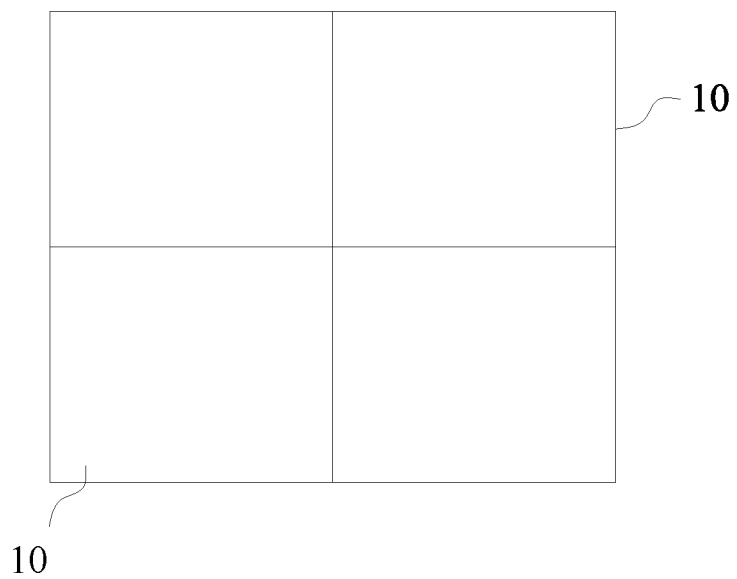
FIG. 9 is a structure diagram of the LED panel provided by the present disclosure.

Finally, an LED screen is further provided, in which an LED panel as shown in FIG. 9 is arranged.

The technical principle of the present disclosure is described hereinbefore in combination with optional embodiments. These descriptions aim at explaining the principle of the present disclosure, and should not be explained to limit the scope of the protection of the present disclosure.

INDUSTRIAL APPLICABILITY

The present disclosure provides an LED module, LED panel and LED screen. The present technical solution achieves a full transparent LED screen with the transparency and the pixel density thereof improved dramatically.

What is claimed is:

1. A light-emitting diode (LED) module, comprising:
    a composite layer, at least one LED chipset with an LED chip, at least one driver integrated circuit (IC),
    wherein the composite layer comprises a substrate arranged at the front side; the LED chip and the driver IC are installed at the front side of the composite layer, a wire coming from the cathode of the LED chip is connected to the driver IC; a plurality of blind holes are arranged at the front side of the composite layer, the anode of the LED chip is connected to a positive electrode inside the composite layer through one of the blind holes; a wire coming from the VDD pin of the driver IC is connected to the positive electrode inside the composite layer through one of the blind holes; a wire coming from the GND pin of the driver IC is connected to a negative electrode inside the composite layer through one of the blind holes; the at least one driver IC is connected with each other through a signal line.

2. The LED module according to claim 1, wherein the composite layer is a transparent composite layer.

3. The LED module according to claim 2, wherein each LED chipset corresponds with a driver IC, the LED chipset and the driver IC are arranged in different rows and spaced in each row.

4. The LED module according to claim 2, wherein comprising a plurality of LED chipsets arranged in an array.

5. The LED module according to claim 4, wherein every 2×1, 2×2 or 2×3 LED chipsets form a light-emitting group, each light-emitting group corresponds to a driver IC, the driver IC is arranged at the center of the plane of the light-emitting group.

6. The LED module according to claim 4, wherein every 5 LED chipsets form a light-emitting group, each light-emitting group corresponds to a driver IC and is arranged in two adjacent rows, one row contains two LED chipsets and the other row contains three LED chipsets, the driver IC is arranged between the two adjacent rows.

7. The LED module according to claim 1, wherein the driver IC is an unpackaged bare wafer.

8. The LED module according to claim 1, wherein the wire and the signal line are bound golden wires.

9. The LED module according to claim 1, wherein the composite layer further comprises an electrode layer and a second insulating layer which are sequentially arranged at the rear side of the substrate;
the positive electrode and the negative electrode are arranged in the electrode layer, the substrate is provided with a plurality of blind holes which reach to the positive electrode or the negative electrode.

10. The LED module according to claim 1, wherein the composite layer further comprises a first electrode layer, a first insulating layer, a second electrode layer and a second insulating layer which are sequentially arranged at the rear side of the substrate; one of the first electrode layer and the second electrode layer is configured to be the positive electrode and the other one is configured to be the negative electrode; the blind holes comprise a first blind hole and a second blind hole, the first blind hole penetrates the substrate and reaches to the positive electrode, the second blind hole penetrates the substrate and reaches to the negative electrode; the wire coming from the anode of the LED chip is connected to the positive electrode through the first blind hole; the wire coming from the VDD pin of the driver IC is connected to the positive electrode through the first blind hole; the wire coming from the GND pin of the driver IC is connected to the negative electrode through the second blind hole.

11. The LED module according to claim 1, wherein the composite layer further comprises a first electrode layer, a first insulating layer, a second electrode layer and a second insulating layer which are sequentially arranged at the rear side of the substrate; one of the first electrode layer and the second electrode layer is configured to be the positive electrode and the other one is configured to be the negative electrode; the blind holes comprise a first blind hole and a second blind hole, the first blind hole penetrates the substrate and reaches to the positive electrode, the second blind hole penetrates the substrate and reaches to the negative electrode; the wire coming from the anode of the LED chip is connected to the positive electrode through the first blind hole; the wire coming from the VDD pin of the driver IC is connected to the positive electrode through the first blind hole; the wire coming from the GND pin of the driver IC is connected to the negative electrode through the second blind hole; wherein the LED module further comprises a third insulating layer and a signal line layer which is insulated from the first electrode layer or the second electrode layer with the third insulation layer; the blind holes comprise a third blind hole, which penetrates the substrate and reaches to the signal line layer; the signal line is a signal pattern layer arranged in the signal line layer, a wire coming from a signal pin of the driver IC is connected to the signal pattern layer through the third blind hole.

12. The LED module according to claim 11, wherein the composite layer comprises at least two layers of the signal line layers and at least two layers of the third insulating layers.

13. The LED module according to claim 11, wherein a pad is arranged at the bottom of each blind hole, the wire is electrically connected to the composite layer through the pad.

14. The LED module according to claim 13, wherein an LED chipset comprises a red-LED (R-LED) chip, a green-LED (G-LED) chip and a blue-LED (B-LED).

15. The LED module according to claim 14, wherein the R-LED chip is installed on a first pad corresponding to the first blind hole by bonding with silver glue; the G-LED chip and the B-LED chip are installed on the first pad corresponding to the first blind hole by bonding with insulating glue.

16. The LED module according to claim 1, wherein the LED chip and the driver IC are installed on the substrate by using a chip-on-board (COB) process or a chip-on-glass (COG) process, the front side of the substrate is covered with transparent sealing glue.

17. An LED panel, comprising at least two LED modules, wherein each of the LED modules comprises:
a composite layer, at least one LED chipset with an LED chip, at least one driver integrated circuit (IC),
wherein the composite layer comprises a substrate arranged at the front side; the LED chip and the driver IC are installed at the front side of the composite layer, a wire coming from the cathode of the LED chip is connected to the driver IC; a plurality of blind holes are arranged at the front side of the composite layer, the anode of the LED chip is connected to a positive electrode inside the composite layer through one of the blind holes; a wire coming from the VDD pin of the driver IC is connected to the positive electrode inside the composite layer through one of the blind holes; a wire coming from the GND pin of the driver IC is connected to a negative electrode inside the composite layer through one of the blind holes; the at least one driver IC is connected with each other through a signal line.

18. An LED screen, comprising an LED panel,
wherein the LED panel comprises at least two LED modules,
wherein each of the LED modules comprises:
a composite layer, at least one LED chipset with an LED chip, at least one driver integrated circuit (IC),
wherein the composite layer comprises a substrate arranged at the front side; the LED chip and the driver IC are installed at the front side of the composite layer, a wire coming from the cathode of the LED chip is connected to the driver IC; a plurality of blind holes are arranged at the front side of the composite layer, the anode of the LED chip is connected to a positive electrode inside the composite layer through one of the blind holes; a wire coming from the VDD pin of the driver IC is connected to the positive electrode inside the composite layer through one of the blind holes; a wire coming from the GND pin of the driver IC is connected to a negative electrode inside the composite layer through one of the blind holes; the at least one driver IC is connected with each other through a signal line.

19. The LED panel according to claim 17, wherein the composite layer is a transparent composite layer.

20. The LED panel according to claim 19, wherein each LED chipset corresponds with a driver IC, the LED chipset and the driver IC are arranged in different rows and spaced in each row.

\* \* \* \* \*